United States Patent
Li et al.

(10) Patent No.: US 12,316,728 B2
(45) Date of Patent: May 27, 2025

(54) PHASE AND FREQUENCY ERROR PROCESSING

(71) Applicant: Microsemi Semiconductor ULC, Ottawa (CA)

(72) Inventors: Xihao Li, Ottawa (CA); Tariq Haddad, Ottawa (CA)

(73) Assignee: Microsemi Semiconductor ULC, Ottawa (CA)

( * ) Notice: Subject to any disclaimer, the term of this patent is extended or adjusted under 35 U.S.C. 154(b) by 462 days.

(21) Appl. No.: 17/659,803

(22) Filed: Apr. 19, 2022

(65) Prior Publication Data

US 2022/0337387 A1 Oct. 20, 2022

Related U.S. Application Data

(60) Provisional application No. 63/201,227, filed on Apr. 19, 2021.

(51) Int. Cl.
*H04L 7/033* (2006.01)
*H04L 7/00* (2006.01)

(52) U.S. Cl.
CPC ............ *H04L 7/033* (2013.01); *H04L 7/0033* (2013.01)

(58) Field of Classification Search
CPC ..... H04L 7/033; H04L 7/0033; H03L 7/0805; H03L 7/0807; H03L 7/087; H03L 7/093; H04J 3/0667; H04J 3/0658
See application file for complete search history.

(56) References Cited

U.S. PATENT DOCUMENTS

| | | | | |
|---|---|---|---|---|
| 4,987,386 A | * | 1/1991 | Poklemba | ............... H03L 7/087 331/25 |
| 2009/0052602 A1 | * | 2/2009 | Annampedu | ........... H03L 7/093 375/376 |
| 2014/0320186 A1 | * | 10/2014 | Jin | ........................ H03L 7/1075 327/159 |

FOREIGN PATENT DOCUMENTS

WO 2018/096305 A1 5/2018

OTHER PUBLICATIONS

Andrich Carsten et al: "A Fast and Stable Time Locked Loop for Network Time Synchronization with Parallel FLL and PLL", 2018 IEEE International Symposium for Precision Clock Synchronization for Measurement, Control, and Communication, (Sep. 2018), pp. 1-4.

International Search Report for International Application No. PCT/US2022/071804, mailed Aug. 1, 2022, 6 pages.

International Written Opinion for International Application No. PCT/US2022/071804, mailed Aug. 1, 2022, 7 pages.

(Continued)

*Primary Examiner* — Farid Seyedvosoghi
(74) *Attorney, Agent, or Firm* — TraskBritt

(57) ABSTRACT

One or more examples relate, generally to phase and frequency error processing. An apparatus includes a phase path and a frequency path. The phase path processes phase error of communications between network nodes. The phase path includes a closed-loop feedback loop controller. The frequency path processes frequency error of the communications between the network nodes. The frequency path is separate from the phase path. A method of processing phase error and frequency error includes selecting first packets for phase processing, processing the first packets for phase error, selecting second packets for frequency processing, and processing the second packets for frequency error independently of the processing of the first packets.

18 Claims, 7 Drawing Sheets

(56) References Cited

OTHER PUBLICATIONS

Mills DL, "Internet Time Synchronization: The Network Time Protocol", IEEE Transactions on Communications, vol. 39, No. 10, (Oct. 1991), pp. 1482-1493.
Zhu Wensi, "IEEE 1588 Implementation with FLL vs. PLL", 2013 IEEE International Symposium on Precision Clock Synchronization for Measurement, (Sep. 2013), pp. 71-76.

* cited by examiner

PHASE AND FREQUENCY ERROR PROCESSING

CROSS-REFERENCE TO RELATED APPLICATION

This application claims the benefit under 35 U.S.C. § 119(e) of U.S. Provisional Patent Application No. 63/201,227, filed Apr. 19, 2021, and titled "MULTI-PATH INTEGRATED PHASE AND FREQUENCY PHASE LOCKED LOOP ARCHITECTURE AND RELATED SYSTEMS, METHODS, AND DEVICES," the entire disclosure of which is hereby incorporated herein by this reference.

TECHNICAL FIELD

This disclosure relates generally to an independent phase and frequency processing for packets communicated between network nodes.

BACKGROUND

The Precision Time Protocol (PTP) is a timing over a network technology under specification by the Institute of Electrical and Electronics Engineers (IEEE) as IEEE 1588. IEEE 1588 timing over packet systems calculate two-way (forward and reverse) transit times using Ethernet packets. Forward and reverse paths may be combined to obtain server-client phase error.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1:
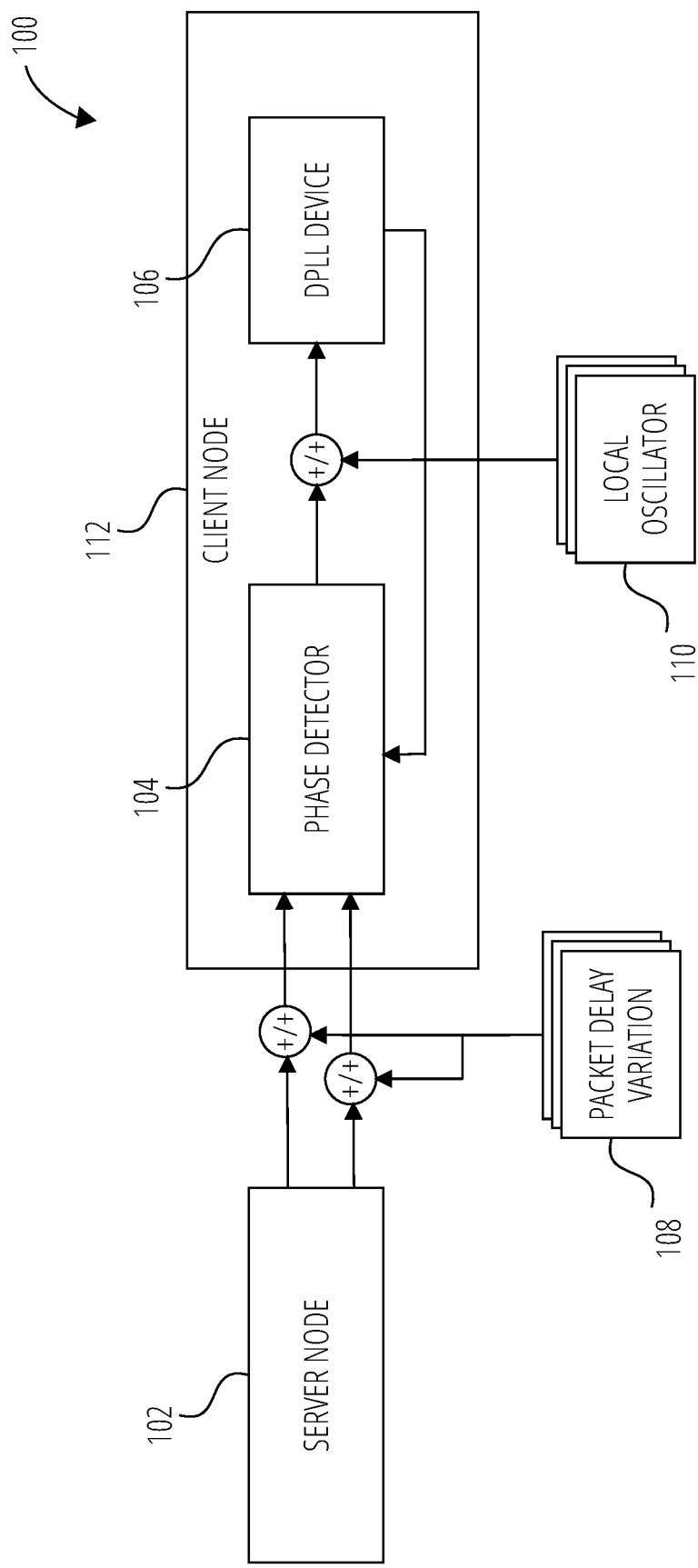
FIG. 1 is a block diagram of a timing over packet system, according to various examples.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is programmed to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

IEEE 1588 timing over packet systems perform phase and frequency recovery for analog clock signals between network nodes. One approach for conforming to IEEE 1588 is to provide semiconductor devices and software algorithm packages for implementing an IEEE 1588 timing over packet system. An IEEE 1588 software package may implement various phase or frequency recovery algorithms. The components of such algorithms include filters and loop controllers with specific target performance requirements.

A typical proportional plus integral phase locked loop (PLL) model for phase alignment using combined path phase error data may be used to perform phase and frequency recovery. In this case, phase alignment implies frequency alignment. The proportional plus integral PLL model may be paired with additional filters before or after the main proportional plus integral loop filter. Such a proportional plus integral PLL model may include two main algorithm types, namely GROUP_1 algorithm types and GROUP_2 algorithm types. The GROUP_1 algorithm types implement separate phase and frequency recovery. In this case the frequency recovery may be performed by a Kalman filter-based estimator. The phase recovery may be performed by a non-fixed rate unit. This algorithm is able to deliver acceptable wander generation results in the presence of network packet delay variations. One shortcoming of this algorithm, however, relates to challenges in properly providing wander transfer behavior for fixed bandwidth and gain-peaking metrics.

The GROUP_2 algorithm types implement a standard PLL control loop. This algorithm may deliver the standard PLL wander transfer behavior with a relatively high bandwidth. One shortcoming of this algorithm type, however, is relatively poorer wander generation performance in the presence of network packet delay variations.

One or more examples disclosed herein reduce the shortcomings of the GROUP_1 and GROUP_2 algorithm types while utilizing the strengths of both approaches. One or more examples disclosed herein provide well-defined wander transfer characteristics based, at least in part, upon bandwidth and gain-peaking mandatory requirements. One or more examples disclosed herein simultaneously provide good wander generation results in the presence of network packet delay variations. One or more examples disclosed herein facilitate meeting specified ITU timing standards (G.8273.4), and reduce overall maintenance requirements.

In various examples disclosed herein, integrated phase and frequency recovery methods with separated treatments for the phase and frequency information may be used. A new architecture for separate and simultaneous phase and frequency alignment in timing over packet systems is disclosed. The new architecture may be programmed to have similar input-output responses to conventional PLLs, but have significantly different internal implementations leading to several advantageous characteristics.

One or more examples disclosed herein simultaneously provide full control over transfer function characteristics (bandwidth and gain-peaking) and provide intelligent filtering of packet delay variation and oscillator noise sources (time error). In addition, one or more examples disclosed herein improve phase slope and frequency change limiters, active an inactive modes of operations with hitless switching, status reporting based upon phase and frequency information, and state machine transitions based, at least in part, upon phase and frequency information.

One or more examples disclosed herein include two separate low-pass filters, one for phase data and one for frequency data. One or more examples disclosed herein separate packet selection blocks for phase and frequency data paths. A phase low-pass filter is closed-loop, a phase locked loop implementation with no integral part. A frequency low-pass filter is quasi-open-loop, an infinite impulse response (IIR) low-pass filter. A digital phase locked loop (DPLL) is defined by bandwidth and damping factor (e.g., a model specified by an International Telecommunication Union (ITU) standard, without limitation), and determines a −3 dB frequency and gain-peaking. A transfer function of one or more examples disclosed herein may be made the same as that for a standard phase locked loop (PLL). As a non-limiting example, a DPLL bandwidth may be substantially the same as a bandwidth of the phase low-pass filter or the frequency low-pass filter, whichever is higher. Also, a DPLL damping may be substantially the same as a ration between bandwidths of the phase low-pass filter and the frequency low-pass filter. The architecture proposed herein may have a standard PLL response from input-output viewpoint, but may internally be very different from a standard PLL.

Disclosed herein is an integrated solution for phase and frequency recovery, which includes separate closed and quasi-open-loop filters for OFM and frequency data. In one or more examples, a phase and frequency recovery architecture includes separate processing for phase (OFM) and frequency data. Such a phase and frequency recovery architecture has substantially the same input-output response (time and frequency domain) as a standard proportional plus integral PLL using only OFM data, but internally is different from a standard proportional plus integral PLL.

In one or more examples a programmable path may include independent phase and frequency bandwidths. An end system may be phase or frequency dominated in contrast to a standard PLL.

In one or more examples an architecture permits separate performance optimizations of phase and frequency paths as demanded by packet delay variation (PDV) patterns. The frequency path may use only the forward or reverse packet streams instead of combined OFM data to improve accuracy.

In various examples separate phase and frequency processing permits intuitive implementation of phase slope and frequency slope limiters, in contrast to traditional PLLs, which do not permit such features due to stability and performance issues.

FIG. 1 is a block diagram of a timing over packet system 100, according to various examples. The timing over packet system 100 includes a server node 102 and a client node 112. The client node 112 includes a phase detector 104 (e.g., to perform operations specified by IEEE 1588) and a digital phase locked loop device (DPLL device 106). Sources of noise of the timing over packet system 100 include packet delay variation 108 and a local oscillator 110. The timing over packet system 100 may include additional elements, which are not shown, for creating a full IEEE 1588 system. The DPLL device 106 may be used for physical verification.

The local oscillator 110 is a noise source in the form of a time-varying stochastic frequency offset. The local oscillator 110 is characterized by a library of recorded and generated files. The local oscillator 110 is to be compensated for by a GROUP_4 algorithm (an International Telegraph and Telephone Consultative Committee of the ITU Group 4 compression algorithm as presently contemplated or expected by the inventors of this disclosure).

The packet delay variation 108 is a noise source in the form of forward and reverse path time varying delays. The packet delay variation 108 is characterized by a library of recorded and generated files. The packet delay variation 108 is to be compensated for by a GROUP_4 algorithm.

In one or more examples, performance requirements of the timing over packet system 100 may be defined in specifications of ITU timing standards. There are two main requirement categories typically specified in an ITU timing standard: wander transfer and wander generation. Wander transfer sets bandwidth and gain-peaking requirements on the measured frequency domain response between network nodes. Wander generation sets time error (TE) and time interval error (TIE) limits in the presence of network and system noise. The noise sources include network PDV and oscillator drift.

The inventors of this disclosure expect some ITU timing standards to have specific requirements for both wander transfer and wander generation. As a non-limiting example, the inventors of this disclosure expect that upcoming ITU standard G.8273.4 will have a 1-3 millihertz (mHz) bandwidth requirement, a less than 0.1 decibel (dB) gain-peaking requirement, and less than 1 microsecond (µs) time error and time interval error with provided PDV patterns requirements. One or more examples of phase detector 104 and DPLL device 106 disclosed herein may meet or exceed expected requirements. It is specifically contemplated that the requirement may change, and one or more disclosed examples of phase detector 104 and DPLL device 106 may accommodate less or more restrictive requirements for wander transfer and wander generation than presently expected by the inventors of this disclosure. The inventors of this disclosure expect that it will be a requirement under ITU standard G.8273.4 as others to meet wander generation limits in the presence of network packet delay variation and local oscillator drift, and to exhibit reliably well-defined and measurable bandwidth and gain-peaking behavior.

One or more examples disclosed herein may improve on loop controllers for phase locked loops implemented by a proportional+integral controller by separating the treatment of phase and frequency information. Conventional loop controllers known to the inventors of this disclosure, which are closed-loop, operate on phase error data, and have an overall response that is defined by the closed-loop bandwidth and gain-peaking values. One or more examples disclosed herein treat the phase error with a standard closed-loop PLL loop controller, which implements a closed-loop low-pass filter. One or more examples disclosed herein treat the frequency error with an open-loop frequency estimator implemented as a separate low-pass filter. Both phase and frequency input data have separate pre-filters for the input data. The overall frequency response for the architecture may be analytically derived. It may be shown that the overall bandwidth and gain-peaking characteristics of the system may be fully controlled by setting the phase and frequency path low-pass filter frequency.

Figure 2:
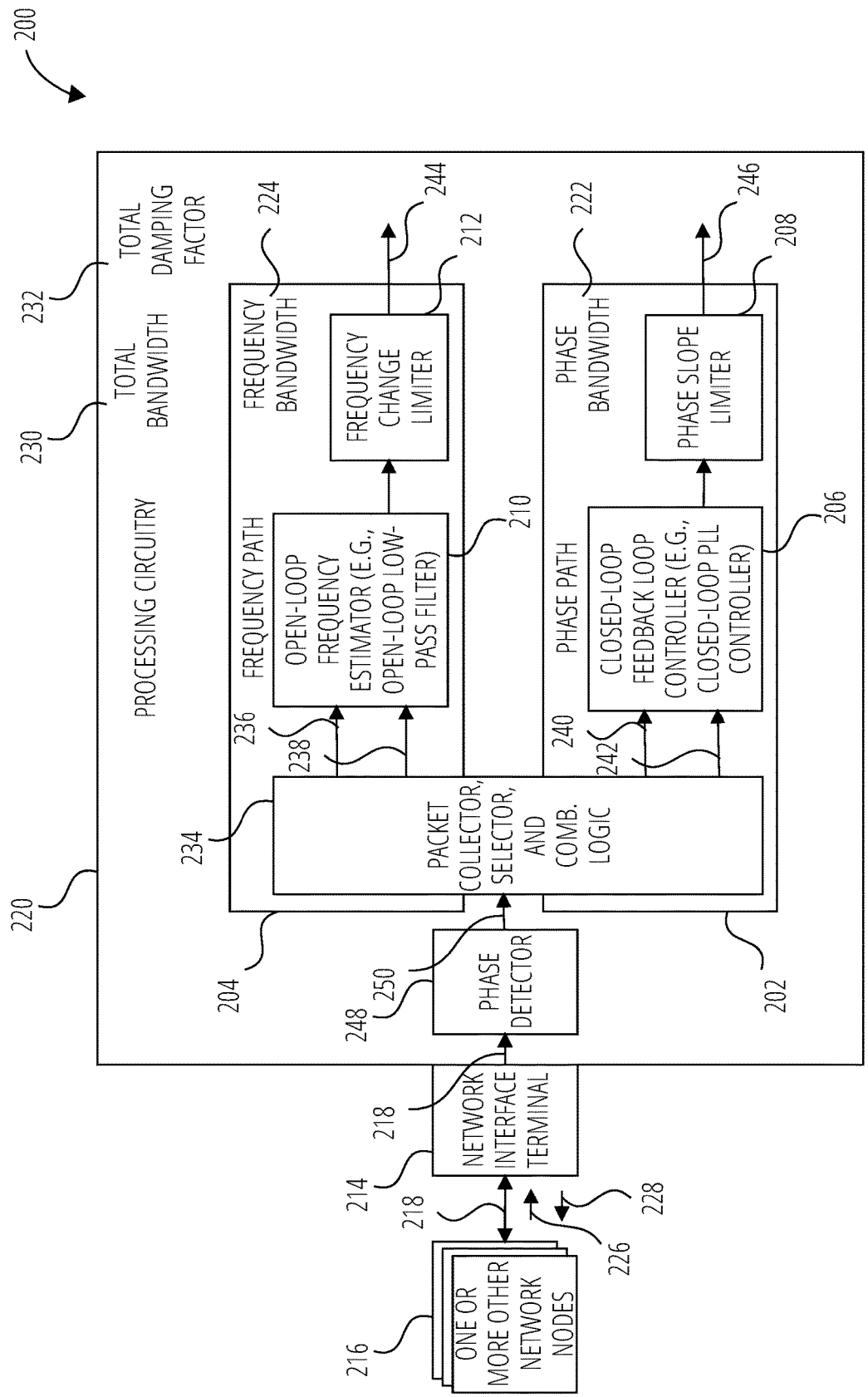
FIG. 2 is a block diagram of a network node in communication with one or more other network nodes, according to various examples.

FIG. 2 is a block diagram of a network node 200 in communication with one or more other network nodes 216, according to various examples. The network node 200 may be an example of the client node 112 illustrated in FIG. 1. The network node 200 includes a network interface terminal 214 and a processing circuitry 220. The processing circuitry 220 includes a phase detector 248, which may be an example of the phase detector 104 of FIG. 1. The processing circuitry 220 also includes a frequency path 204 and a phase path 202, which are examples of portions of the DPLL device 106 of FIG. 1. The open-loop frequency estimator 210 includes a portion of a packet collector, selector, and combination logic 234, an open-loop frequency estimator 210, and a frequency change limiter 212. The phase path 202 includes another portion of the packet collector, selector, and combination logic 234, a closed-loop feedback loop controller 206, and a phase slope limiter 208.

Communication packets 218 including a forward packet stream 226 and a reverse packet stream 228 are communicated between the one or more other network nodes 216 and the network node 200. The forward packet stream 226 is communicated from the one or more other network nodes 216 to the network interface terminal 214 of the network node 200. The reverse packet stream 228 is communicated from the network interface terminal 214 of the network node 200 to the one or more other network nodes 216. Stated another way, the network interface terminal 214 delivers and receives communication packets 218 to and from the one or more other network nodes 216.

The phase detector 248 determines transit times 250 (e.g., a forward transit time and a reverse transit time of packets corresponding to the forward packet stream 226 and the reverse packet stream 228, respectively) of the communication packets 218. The forward transit time is a transit time for packets of the forward packet stream 226 to transit from one of the one or more other network nodes 216 to the network node 200. The reverse transit time is a transit time for packets of the reverse packet stream 228 to transit from the network node 200 to one of the one or more other network nodes 216. The phase detector 248 provides the transit times 250 and the communication packets 218 to the packet collector, selector, and combination logic 234.

The packet collector, selector, and combination logic 234 selects first packets 236 for frequency processing and determines frequency error 238 corresponding to the first packets 236. The packet collector, selector, and combination logic 234 provides the 236 and the frequency error 238 to the open-loop frequency estimator 210 for processing. The packet collector, selector, and combination logic 234 also selects second packets 240 for phase processing and determines phase error 242 corresponding to the second packets 240. The packet collector, selector, and combination logic 234 provides the second packets 240 and the phase error 242 to the closed-loop feedback loop controller 206.

The processing circuitry 220 processes, by the closed-loop feedback loop controller 206 (e.g., a closed-loop phase locked loop (PLL) controller), the phase error 242 of the communication packets 218 communicated between the network node 200 and the one or more other network nodes 216. For example, the processing circuitry 220 includes the phase path 202 to process the phase error 242 of communications between network node 200 and the one or more other network nodes 216 to generate phase adjustments 246, which may be limited by a phase slope limiter 208. In some examples the closed-loop feedback loop controller 206 (e.g., the closed-loop PLL controller) may be implemented as a closed-loop low-pass filter. In examples where the open-loop frequency estimator 210 includes a closed-loop PLL controller, the closed-loop PLL controller may be free of an integral portion.

The processing circuitry 220 also processes the frequency error 238 of the communication packets 218 communicated between the network node 200 and the one or more other network nodes 216 independently from the closed-loop feedback loop controller 206. For example the processing circuitry 220 includes the frequency path 204 to process the frequency error 238 of the communications between the network node and the one or more other one or more other network nodes 216. The frequency path 204 is separate from the phase path 202. The frequency path 204 includes an open-loop frequency estimator 210 (e.g., an open-loop low-pass filter). The processing circuitry 220 may process the frequency error 238 using the open-loop frequency estimator 210 to generate frequency adjustments 244, which are limited by a frequency change limiter 212. In some examples the frequency path 204 may process only one of the forward packet stream 226, the reverse packet stream 228, or combined phase data from the forward packet stream 226 and the reverse packet stream 228. The only one of the forward packet stream 226, the reverse packet stream 228, or the combined phase data is selectable to be processed by the frequency path 204 responsive to noise levels of the forward packet stream 226 and the reverse packet stream 228.

The open-loop frequency estimator 210 is implemented as an open-loop low-pass filter to enable multipath monitoring. By way of non-limiting example, multiple instances of an open-loop low-pass filter operating as the open-loop frequency estimator 210 may be used in parallel, each to monitor different communication pathways to various ones of the one or more other network nodes 216. In some examples the frequency bandwidths 224 of these various open-loop low-pass filters may be different from each other.

In some examples the frequency path 204 and the phase path 202 may be implemented using separate software algorithms that operate independently of each other. In some examples the frequency path 204 and the phase path 202 may be implemented using hardware elements (e.g., logic circuits, other circuitry, without limitation). In some examples the frequency path 204 and the phase path 202 may be implemented using combinations of software and hardware elements.

In some examples the phase path 202 includes a phase slope limiter 208 and the frequency path 204 includes a frequency change limiter 212. The phase slope limiter 208 and the frequency change limiter 212 may limit the phase slope and the frequency change of outputs signals of the frequency path 204 and the phase path 202 to be within specified ranges for input terminals of other devices that may receive the output signal.

The frequency path 204 may have a frequency bandwidth 224 associated therewith. Also, the phase path 202 may have a phase bandwidth 222 associated therewith. In some examples the frequency bandwidth 224 may be different from the phase bandwidth 222. In some examples the phase bandwidth 222 and the frequency bandwidth 224 are programmable. By way of non-limiting example, cutoff frequencies (e.g., 3 dB attenuation frequencies) of transfer functions of the respective open-loop frequency estimator 210 and the closed-loop feedback loop controller 206 may be built into the open-loop frequency estimator 210 and the closed-loop feedback loop controller 206.

In some examples a total bandwidth 230 of the phase path 202 in parallel with the frequency path 204 is a greater one of the phase bandwidth 222 of the phase path 202 and a frequency bandwidth 224 of the frequency path 204. In some examples a total damping factor 232 of the phase path 202 in parallel with the frequency path 204 is a ratio of the phase bandwidth 222 of the phase path 202 to the frequency bandwidth 224 of the frequency path 204.

The frequency adjustments 244 and the phase adjustments 246 may be combined to generate a total adjustment (e.g., the output signal 336 of FIG. 3), as will be discussed in more detail with reference to FIG. 3 and FIG. 4.

Figure 3:
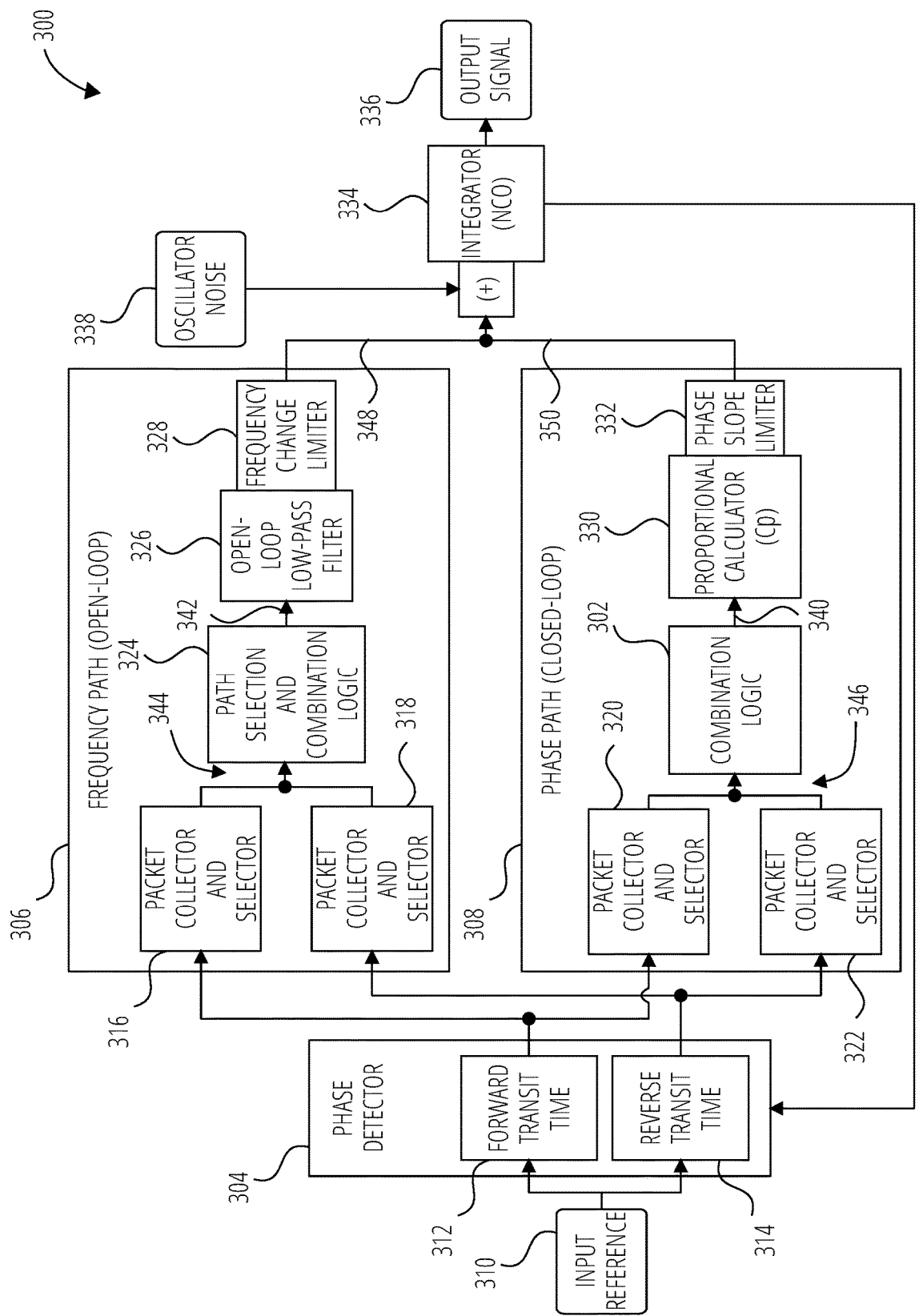
FIG. 3 is a block diagram of a multi-path integrated phase and frequency recovery system, according to various examples.

FIG. 3 is a block diagram of a multi-path integrated phase and frequency recovery system 300, according to various examples. The multi-path integrated phase and frequency recovery system 300 may be an example of the network node 200 of FIG. 1. The multi-path integrated phase and frequency recovery system 300 includes a combination of closed-loop and open-loop paths with packet filtering. Specifically, the multi-path integrated phase and frequency recovery system 300 includes a frequency path 306 (e.g., a software frequency path, a hardware frequency path, or combinations thereof), which is an open-loop path, and a phase path 308 (a software phase path, a hardware phase path, or combinations thereof), which is a closed-loop path. The frequency path 306 includes packet collectors and selectors 316, 318, a path selection and combination logic 324, an open-loop low-pass filter 326, and a frequency change limiter 328. The phase path 308 includes packet collectors and selectors 320, 322.

The multi-path integrated phase and frequency recovery system 300 also includes a phase detector 304 and an integrator 334 (e.g., a numerically controlled oscillator (NCO)). The phase detector (e.g., to perform operations specified by IEEE 1588) determines a forward transit time 312 and a reverse transit time 314 of packets (e.g., the communication packets 218 of FIG. 2) from an input reference signal 310. The input reference signal 310 may include a forward packet stream (e.g., the forward packet stream 226 of FIG. 2) and a reverse packet stream (e.g., the reverse packet stream 228 of FIG. 2). The forward transit time 312 is a transit time for packets of the forward packet stream to transit from an other network node (e.g., one of the one or more other network nodes 216 of FIG. 2) to a network node (e.g., the network node 200 of FIG. 2) including the multi-path integrated phase and frequency recovery system 300. The reverse transit time 314 is a transit time for the reverse packet stream to transit from the network node to the other network node. The phase detector 304 provides the forward transit time 312 and the forward packet stream to the packet collector and selector 316 (in the frequency path 306) and to the packet collector and selector 320 (in the phase path 308). The phase detector 304 also provides the reverse transit time 314 and the reverse packet stream to the packet collector and selector 318 (in the frequency path 306) and to the packet collector and selector 322 (in the phase path 308).

The packet collectors and selectors 316, 318, 320, and 322 select packets for further processing. For example, the packet collector and selector 316 selects from packets of the forward packet stream of the input reference signal 310 for frequency processing. Also, the packet collector and selector 318 selects from packets of the reverse packet stream of the input reference signal 310 for frequency processing. The packet collector and selector 316 and the packet collector and selector 318 provide their respective selected packets as first packets 344 to the path selection and combination logic 324. Furthermore, the packet collector and selector 320 selects from the packets of the forward packet stream of the input reference signal 310 for frequency processing. In addition, the packet collector and selector 322 selects from the packets of the reverse packet stream of the input reference signal 310 for phase processing. The packet collector and selector 320 and the packet collector and selector 322 provide their respective selected packets as second packets 346 to the combination logic 302.

Packet selection for phase processing and frequency processing involves non-trivial considerations. For phase path packet collection, phase values should be compensated with a previous phase adjustment and a previous frequency adjustment for true minimum transit time. Accordingly, the packet collector and selector 320 and the packet collector and selector 322 may compensate phase values of the second packets 346 with a previous phase adjustment and a previous frequency adjustment. For frequency path packet collection, values should also be compensated with previous phase and frequency path adjustments for true minimum transit time. Accordingly, the packet collector and selector 316 and the packet collector and selector 318 may compensate phase values of the first packets 344 with a previous phase adjustment and a previous frequency adjustment.

In some examples the packet collectors and selectors 316, 318 may select the first packets for frequency processing responsive to one of a minimum transit time (e.g., a minimum of the forward transit time 312 and the reverse transit time 314) or a mean transit time (e.g., a mean of the forward transit time 312 and the reverse transit time 314). In some examples the packet collectors and selectors 320, 322 may select the second packets 346 responsive to a minimum transit time (e.g., a minimum of the forward transit time 312 and the reverse transit time 314).

The path selection and combination logic 324 generates a frequency error 342 responsive to the first packets 344. The frequency error 342 is a difference between a frequency of the input reference signal 310 and the output signal 336. The path selection and combination logic 324 determines which of the first packets 344 (e.g., those corresponding to the forward packet stream, the reverse packet stream, or a combination thereof) upon which to base the frequency error 342 upon. Accordingly, the frequency path 306 is to process only one of the forward packet stream, the reverse packet stream, or a combined phase data from the forward packet stream and the reverse packet stream. The only one of the forward packet stream, the reverse packet stream, or the combined phase data is selectable to be processed by the frequency path 204 responsive to noise levels of the forward packet stream and the reverse packet stream. The noise levels correspond to delays on the packets for the forward and reverse packet streams. The path selection and combination logic 324 provides the frequency error 342 to the open-loop low-pass filter 326.

In the phase path 308, the combination logic 302 determines a phase error 340, which is a difference between a phase of the input reference signal 310 and the output signal 336. In contrast to the path selection and combination logic 324 of the frequency path 306, which selects between packets from the forward packet stream, the reverse packet stream, and combined packets to determine the frequency error 342, the combination logic 302 combines the second packets 346 from the forward packet stream and the reverse packet stream to determine the phase error 340. The combination logic 302 provides the phase error 340 to the proportional calculator 330.

The open-loop low-pass filter 326 receives the frequency error 342, and determines a frequency adjustment 348, which is limited by the frequency change limiter 328, responsive to the frequency error 342. In some examples the open-loop low-pass filter 326 may be an open-loop frequency estimator (e.g., the open-loop frequency estimator 210 of FIG. 2) implemented as an open-loop frequency estimator. Feedback may ultimately influence the open-loop low-pass filter 326 since feedback may be provided from the integrator 334 to the phase detector 304. The open-loop low-pass filter 326, however, is not directly closed-loop. The open-loop low-pass filter 326 provides the frequency adjustment 348, via the frequency change limiter 328, to the integrator 334.

The proportional calculator 330 receives the phase error 340, and determines a phase adjustment 350, which is limited by the phase slope limiter 332, responsive to the phase error 340. The phase adjustment 350 may be provided in terms of a frequency adjustment for compensating for the phase error 340. In some examples the proportional calculator 330 may be a closed-loop PLL controller. In some examples the proportional calculator 330 may be a closed-loop PLL controller that is free of an integral portion (e.g., leaving a proportional portion). In some examples the proportional calculator 330 may implement a closed-loop low-pass filter. The proportional calculator 330 provides the phase adjustment 350, via the frequency change limiter 328, to the integrator 334.

The integrator 334 receives the frequency adjustment 348 and the phase adjustment 350, and integrates a sum of the frequency adjustment 348 and the phase adjustment 350 to generate an output signal 336, which is a total adjustment. FIG. 3 acknowledges that an oscillator noise 338 will also influence the output signal 336 (illustrated by the oscillator noise 338 being added to the frequency adjustment 348 and the phase adjustment 350 at the integrator 334). This oscillator noise 338 may be from an oscillator that is used to clock various circuit elements of the multi-path integrated phase and frequency recovery system 300. The output signal 336 is fed back to the phase detector 304, and may be provided to an other electronic device. The frequency change limiter 328 and the phase slope limiter 332 may limit the frequency change and the phase slope of the frequency adjustment 348 and the phase adjustment 350, respectively, responsive to frequency change limits at an input terminal of the other electronic device to keep signals at the input terminal within tolerable limits for the other electronic device.

The multi-path integrated phase and frequency recovery system 300 may also include a phase path 308 or frequency path 306 dominated response. By contrast, PLLs alone are dominated by a phase path closed-loop response. By deriving a transfer function of the multi-path integrated phase and frequency recovery system 300, a standard PLL transfer function may be imitated by the parallel combination of the frequency path 306 with the phase path 308, but with a frequency path 306 dominated response. The overall transfer function of the parallel combination of the frequency path 306 with the phase path 308 may remain the same, but may be marked with a significant internal departure from the phase path closed-loop dominated responsive characteristic of a PLL alone.

The multi-path integrated phase and frequency recovery system 300 includes multi-rate packet collection rates and different packet selection criteria. Different collection interval and selection criteria may be used for the phase path 308 and the frequency path 306, thereby improving (e.g., optimizing) performance. The frequency path 306 has more optimization options than the phase path 308. A frequency dominated response has better potential performance than a phase dominated response. Better wander generation performance is achieved by combining phase or frequency path dominated response with a combination of closed and open-loop paths.

Time-varying distribution for forward and reverse packet streams may involve intelligent packet processing.

As compared with a PLL alone, the multi-path integrated phase and frequency recovery system 300 has substantially the same bandwidth and gain-peaking (they may both pass the G.8273.4 requirement). Both implementations may be calibrated for equivalent bandwidth and packet processing intervals. The main performance difference of the multi-path integrated phase and frequency recovery system 300 as compared to the PLL is in wander generation results with packet delay variation (PDV) noise. To illustrate, for a proportional plus integral PLL with packet processing, a maximum time interval error (MTIE) may be substantially 1051.3 nanoseconds (ns), a maximum time error (TE) may be 1065.6 ns, and the proportional plus integral PLL may fail the G.8273.4 requirement. By contrast, the multi-path integrated phase and frequency recovery system 300 may have an MTIE of 778.1 ns, a maximum TE of 671.0 ns, and may pass the G.8273.4 requirement.

In addition, as compared to a proportional plus integral PLL alone, the multi-path integrated phase and frequency recovery system 300 may involve simplified state reporting and transition implementation using separate phase and frequency data. Also, the multi-path integrated phase and frequency recovery system 300 may involve simplified phase slope and frequency slope limiter implementations for phase and frequency paths.

Figure 4:
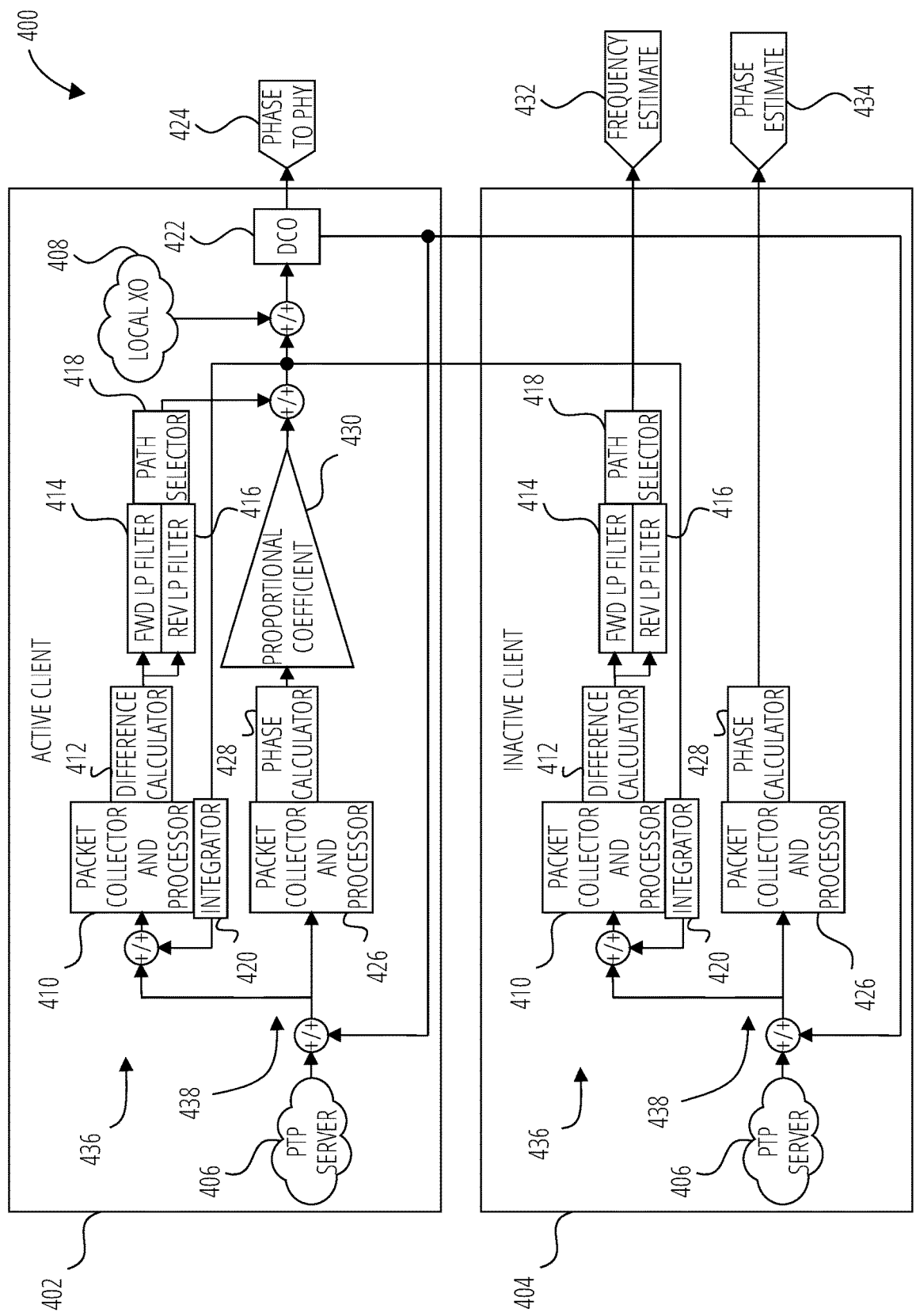
FIG. 4 is a block diagram of a multi-path integrated phase and frequency recovery system, which may be an example of the multi-path integrated phase and frequency recovery system of FIG. 3.

FIG. 4 is a block diagram of a multi-path integrated phase and frequency recovery system 400, which may be an example of the multi-path integrated phase and frequency recovery system 300 of FIG. 3. The multi-path integrated phase and frequency recovery system 400 in some respects includes more detail than the multi-path integrated phase and frequency recovery system 300 of FIG. 3. For example, the multi-path integrated phase and frequency recovery system 400 includes an active client 402 and an inactive client 404, each of which includes its own respective frequency path 436 and phase path 438.

The frequency path 436 of each of the active client 402 and the inactive client 404 includes a packet collector and processor 410, a difference calculator 412, a forward low-pass filter 414, a reverse low-pass filter 416, a path selector 418, and an integrator 420. The packet collector and processor 410 may collect packets provided by and to a PTP server 406. The collected packets may be compensated for using feedback from a digitally controlled oscillator (DCO 422, which may be an example of the integrator 334 (NCO) of FIG. 3) and from an integrator 420. Accordingly, previous phase and frequency adjustments are used to compensate the collected packets.

The difference calculator 412 may calculate transit times (e.g., forward transit times and reverse transit times) of the collected packets. The transit times may be filtered using the forward low-pass filter 414 and the reverse low-pass filter 416 (e.g., the forward transit times may be filtered using the forward low-pass filter 414 and the reverse transit times may be filtered using the reverse low-pass filter 416). The path selector 418 may select whether to process frequency error from the forward packet stream, the reverse packet stream, or both, and provide a phase adjustment corresponding to the selected one of the forward packet stream, the reverse packet stream, or both. In the case of the forward low-pass filter 414, the frequency adjustment is provided as a frequency estimate 432. In the case of the active client 402 the frequency adjustment is provided for use with a phase adjustment from the phase path 438 to generate, by the DCO 422, a total phase adjustment 424 to a physical layer device (PHY). Noise from a local oscillator 408 used to clock circuitry of the active client 402 may be added to the total phase adjustment 424.

The phase path 438 of each of the active client 402 and the inactive client 404 includes a packet collector and processor 426 and a phase calculator 428. The phase calculator 428 receives the packets compensated for by the previous frequency and phase adjustments, and collects the compensated packets. The phase calculator 428, which is an example of the proportional calculator 330 of FIG. 3, may process a phase error of the collected packets, and generate a phase adjustment. In the case of the inactive client 404, the phase adjustment may be provided as a phase estimate 434. In the case of the active client 402 the phase adjustment may be processed by a proportional coefficient 430 and aggregated with the frequency adjustment (e.g., using the DCO 422), to generate the total phase adjustment 424. This total phase adjustment may be fed back to adjust packets from a new iteration of packet collection by the packet collector and processor 410 and the packet collector and processor 426. Also, the phase adjustment, once processed by the proportional coefficient 430, may be fed back to the integrator 420 of each frequency path 436 and used to compensate packets collected by the packet collector and processor 410.

By way of non-limiting example, the packet collectors and processors 410, 426 may down-sample data input thereto. As a specific, non-limiting example, input data at 16 Hertz (Hz) may be processed into one of a 0.1 Hz or a 0.01 Hz data stream. This down-sampling may reduce noise from the input data. Accordingly, in such examples the output data provided by the packet collectors and processors 410, 426 may be of reduced rate as compared to input signals provided to the packet collectors and processors 410, 426.

Figure 5:
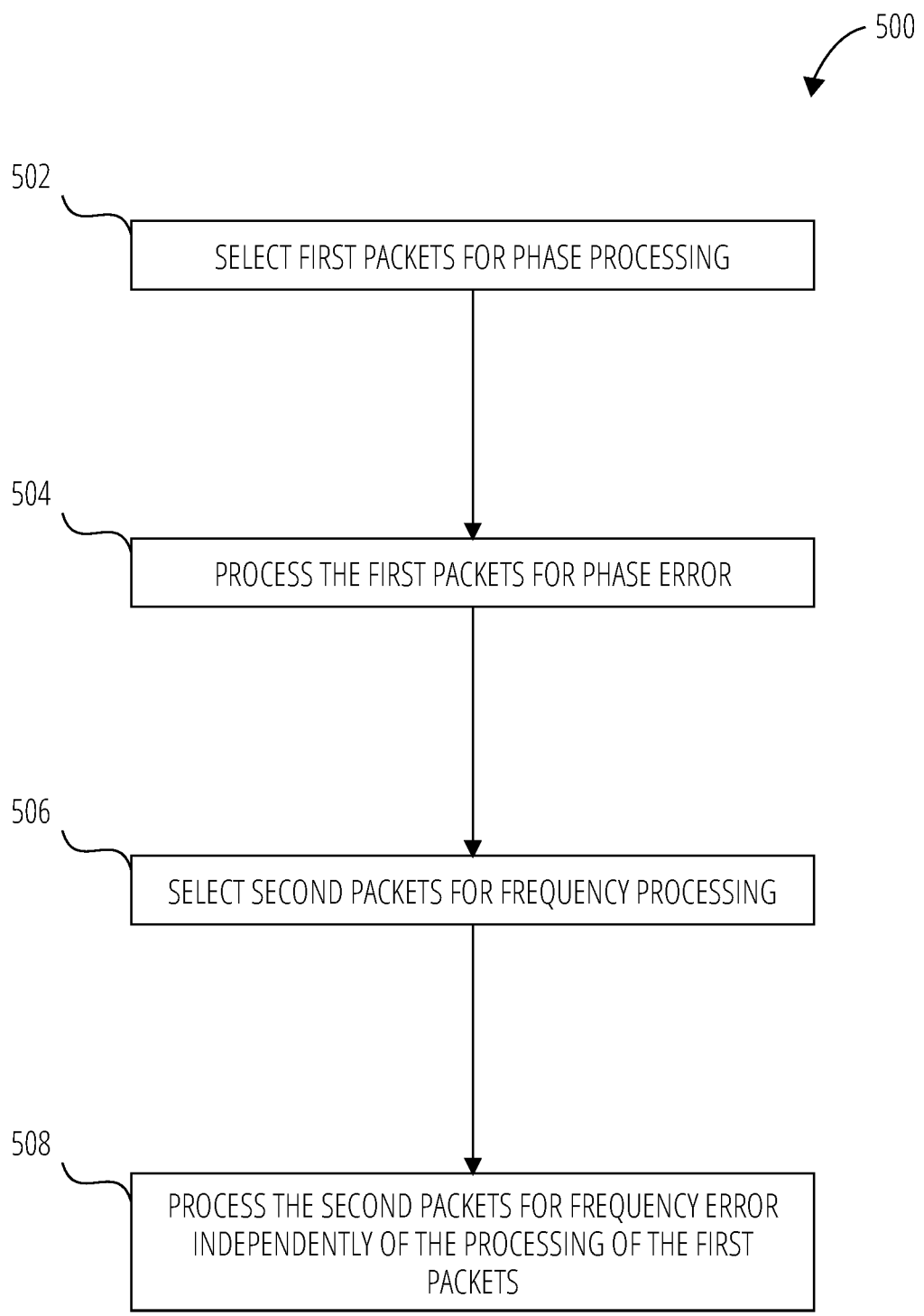
FIG. 5 is a flowchart illustrating a method of processing phase error and frequency error, according to various examples.

FIG. 5 is a flowchart illustrating a method 500 of processing phase error and frequency error, according to various examples. At operation 502 the method 500 includes selecting first packets for phase processing. At operation 504 the 500 includes processing the first packets for phase error. At operation 506 the method 500 includes selecting second packets for frequency processing. At operation 508 the method 500 includes processing the second packets for frequency error independently of the processing of the first packets.

Figure 6:
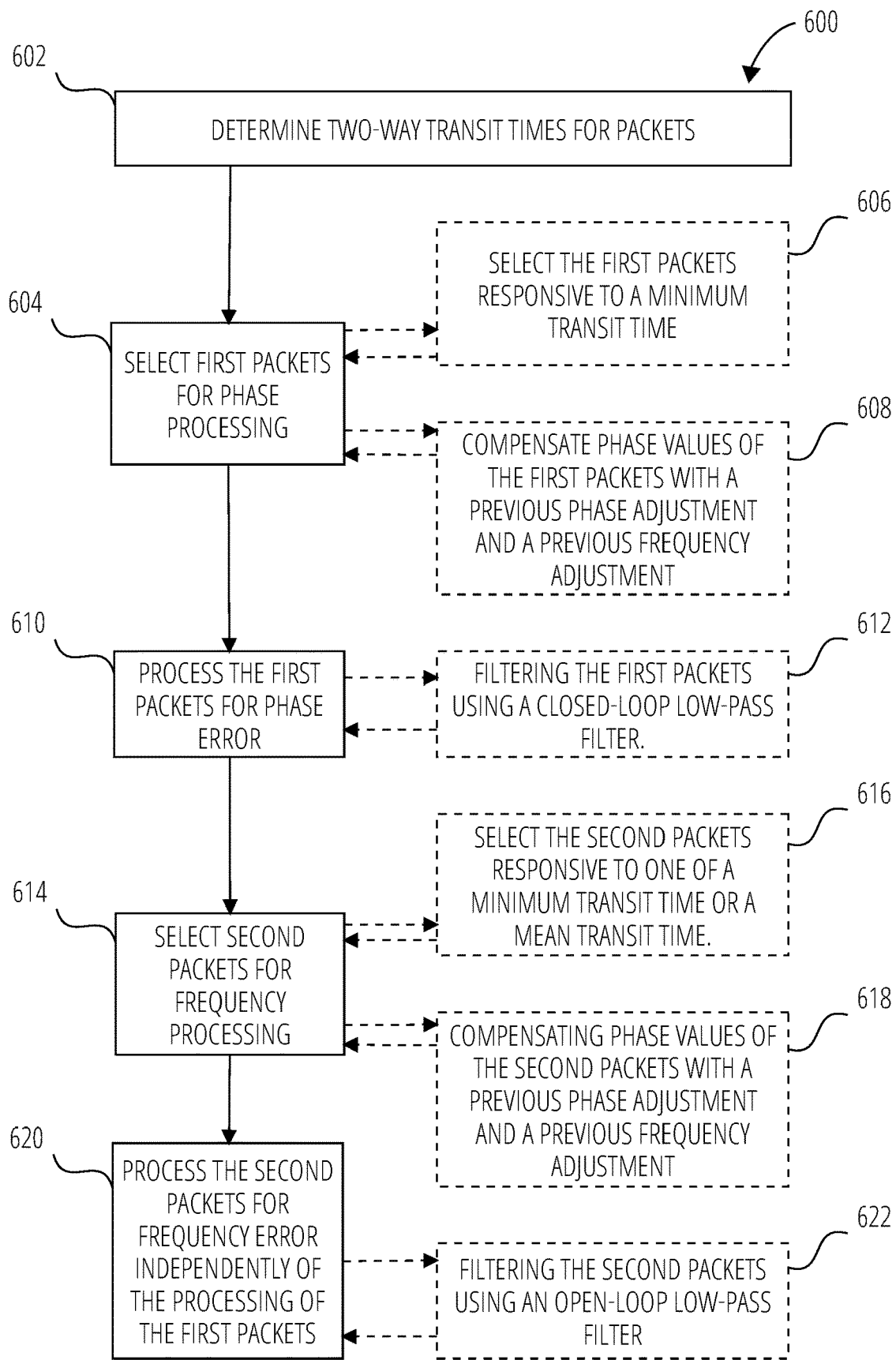
FIG. 6 is a flowchart illustrating a method of processing phase error and frequency error, according to various examples.

FIG. 6 is a flowchart illustrating a method 600 of processing phase error and frequency error, according to various examples. At operation 602 the method 600 includes determining two-way transit times (e.g., forward transit times and reverse transit times) for packets communicated between a network node and one or more other network nodes. At operation 604 the method 600 includes selecting first packets for phase processing. In some examples, at operation 606 selecting the first packets includes selecting the first packets responsive to a minimum transit time. In some examples, at operation 608 selecting the first packets includes compensating phase values of the first packets with a previous phase adjustment and a previous frequency adjustment.

At operation 610 the method 600 includes processing the first packets for phase error. In some examples, at operation 612 the method 600 includes filtering the first packets using a closed-loop low pass filter (e.g., a closed-loop PLL controller implementing a closed-loop low-pass filter).

At operation 614 the method 600 includes selecting second packets for frequency processing. In some examples, at operation 616 selecting the second packets includes selecting the second packets responsive to one of a minimum transit time or a mean transit time. In some examples, at operation 618 selecting the second packets includes compensating phase values of the second packets with a previous phase adjustment and a previous frequency adjustment. At operation 620 the method 600 includes processing the second packets for frequency error independently of the processing of the first packets. In some examples, processing the second packets for frequency error includes filtering the second packets using an open-loop low-pass filter at operation 622.

It will be appreciated by those of ordinary skill in the art that functional elements of one or more examples disclosed herein (e.g., functions, operations, acts, processes, or methods) may be implemented in any suitable hardware, software, firmware, or combinations thereof. FIG. 6 illustrates non-limiting examples of implementations of functional elements disclosed herein. In various examples, some or all portions of the functional elements disclosed herein may be performed by hardware specially prepared (e.g., programmed) for carrying out the functional elements.

Figure 7:
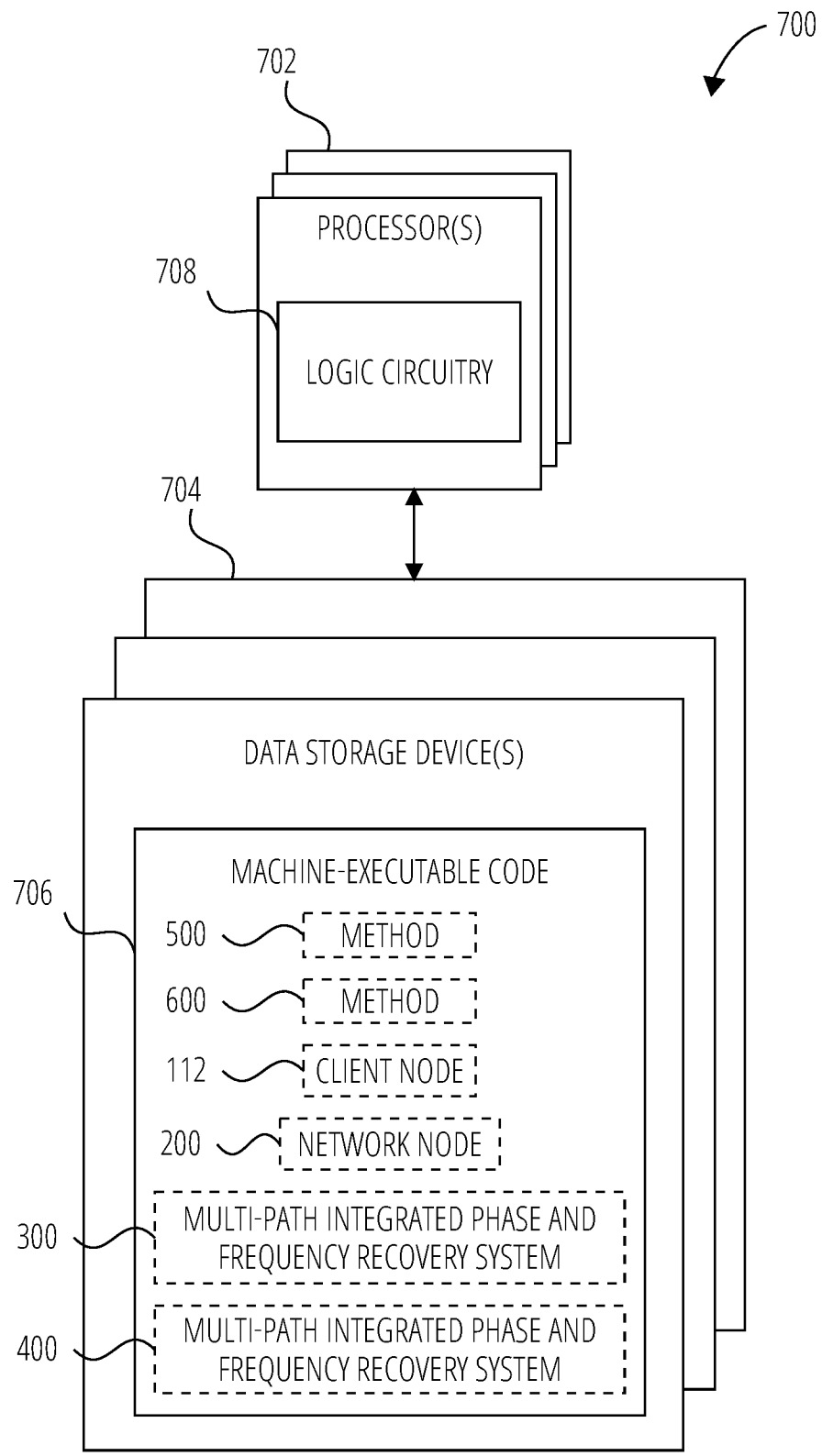
FIG. 7 is a block diagram of circuitry that, in various examples, may be used to implement various functions, operations, acts, processes, or methods disclosed herein.

FIG. 7 is a block diagram of circuitry 700 that, in some examples, may be used to implement various functions, operations, acts, processes, or methods disclosed herein. The circuitry 700 includes one or more processors 702 (sometimes referred to herein as "processors 702") operably coupled to one or more data storage devices (sometimes referred to herein as "storage 704"). The storage 704 includes machine-executable code 706 stored thereon and the processors 702 include logic circuitry 708. The machine-executable code 706 includes information describing functional elements that may be implemented by (e.g., performed by) the logic circuitry 708. The logic circuitry 708 is adapted to implement (e.g., perform) the functional elements described by the machine-executable code 706. The circuitry 700, when executing the functional elements described by the machine-executable code 706, should be considered as special purpose hardware for carrying out functional elements disclosed herein. In various examples the processors 702 may perform the functional elements described by the machine-executable code 706 sequentially, concurrently (e.g., on one or more different hardware platforms), or in one or more parallel process streams.

When implemented by logic circuitry 708 of the processors 702, the machine-executable code 706 is to adapt the processors 702 to perform operations of one or more examples disclosed herein. For example, the machine-executable code 706 may be to adapt the processors 702 to perform at least a portion or a totality of the method 500 of FIG. 5 or the method 600 of FIG. 6. Also, the machine-executable code 706 may be to adapt the processors 702 to perform at least a portion or a totality of the operations discussed for the client node 112 of FIG. 1, the network node 200 of FIG. 2, the multi-path integrated phase and frequency recovery system 300 of FIG. 3, or the multi-path integrated phase and frequency recovery system 400 of FIG. 4.

The processors 702 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is to execute functional elements corresponding to the machine-executable code 706 (e.g., software code, firmware code, hardware descriptions) related to one or more examples of the present disclosure. It is noted that a general-purpose processor (may also be referred to herein as a host processor or simply a host) may be a microprocessor, but in the alternative, the processors 702 may include any conventional processor, controller, microcontroller, or state machine. The processors 702 may also be implemented as a combination of computing devices, such as a combination of a DSP and a microprocessor, a plurality of microprocessors, one or more microprocessors in conjunction with a DSP core, or any other such configuration.

In various examples the storage 704 includes volatile data storage (e.g., random-access memory (RAM)), non-volatile data storage (e.g., Flash memory, a hard disc drive, a solid state drive, erasable programmable read-only memory (EPROM), without limitation). In various examples the processors 702 and the storage 704 may be implemented into a single device (e.g., a semiconductor device product, a system on chip (SOC), without limitation). In various examples the processors 702 and the storage 704 may be implemented into separate devices.

In various examples the machine-executable code 706 may include computer-readable instructions (e.g., software code, firmware code). By way of non-limiting example, the computer-readable instructions may be stored by the storage 704, accessed directly by the processors 702, and executed by the processors 702 using at least the logic circuitry 708. Also by way of non-limiting example, the computer-readable instructions may be stored on the storage 704, transferred to a memory device (not shown) for execution, and executed by the processors 702 using at least the logic circuitry 708. Accordingly, in various examples the logic circuitry 708 includes electrically configurable logic circuitry 708.

In various examples the machine-executable code 706 may describe hardware (e.g., circuitry) to be implemented in the logic circuitry 708 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very-large-large-scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 708 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in various examples the machine-executable code 706 may include an HDL, an RTL, a GL description, a mask level description, other hardware description, or any combination thereof.

In one or more examples where the machine-executable code 706 includes a hardware description (at any level of abstraction), a system (not shown, but including the storage 704) may implement the hardware description described by the machine-executable code 706. By way of non-limiting example, the processors 702 may include a programmable logic device (e.g., an FPGA or a PLC) and the logic circuitry 708 may be electrically controlled to implement circuitry corresponding to the hardware description into the logic circuitry 708. Also by way of non-limiting example, the logic circuitry 708 may include hard-wired logic manufactured by a manufacturing system (not shown, but including the storage 704) according to the hardware description of the machine-executable code 706.

Regardless of whether the machine-executable code 706 includes computer-readable instructions or a hardware description, the logic circuitry 708 is adapted to perform the functional elements described by the machine-executable code 706 when implementing the functional elements of the machine-executable code 706. It is noted that although a hardware description may not directly describe functional elements, a hardware description indirectly describes functional elements that the hardware elements described by the hardware description are capable of performing.

EXAMPLES

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1

An apparatus, comprising: a phase path to process phase error of communications between network nodes, the phase path including a closed-loop feedback loop controller; and a frequency path to process frequency error of the communications between the network nodes, the frequency path separate from the phase path.

Example 2

The apparatus of Example 1, wherein a phase bandwidth of the apparatus is independent from a frequency bandwidth of the apparatus.

Example 3

The apparatus of Example 2, wherein the phase bandwidth and the frequency bandwidth are programmable.

Example 4

The apparatus according to any one of Examples 1-3, wherein the frequency path is to processes one of a forward packet stream, a reverse packet stream, or combined phase data from the forward packet stream and the reverse packet stream.

Example 5

The apparatus of Example 4, wherein the one of the forward packet stream, the reverse packet stream, or the combined phase data is selectable to be processed by the frequency path responsive to noise levels of the forward packet stream and the reverse packet stream.

Example 6

The apparatus according to any of Examples 1-5, wherein the phase path includes a phase slope limiter.

Example 7

The apparatus according to any one of Examples 1-6, wherein the frequency path includes a frequency change limiter.

Example 8

The apparatus according to any one of Examples 1-7, wherein the closed-loop feedback loop controller includes a closed-loop phase locked loop (PLL) controller.

Example 9

The apparatus of Example 8, wherein the closed-loop PLL controller is free of an integral portion.

Example 10

The apparatus according to any one of Examples 1-9, wherein the frequency path includes an open-loop frequency estimator.

Example 11

The apparatus of Example 10, wherein the open-loop frequency estimator is implemented as an open-loop low-pass filter to enable multipath monitoring.

Example 12

The apparatus according to any one of Examples 1-11, wherein a total bandwidth of the phase path in parallel with the frequency path is a greater one of a phase bandwidth of the phase path and a frequency bandwidth of the frequency path.

Example 13

The apparatus according to any one of Examples 1-12, wherein a total damping factor of the phase path in parallel with the frequency path is a ratio of a phase bandwidth of the phase path to a frequency bandwidth of the frequency path.

Example 14

A method of processing phase error and frequency error, the method comprising: selecting first packets for phase processing; processing the first packets for the phase error; selecting second packets for frequency processing; and processing the second packets for the frequency error independently of the processing of the first packets.

Example 15

The method of Example 14, wherein selecting first packets for phase processing comprises compensating phase values of the first packets with a previous phase adjustment and a previous frequency adjustment.

Example 16

The method according to any one of Examples 14 and 15, wherein selecting second packets for frequency processing comprises compensating phase values of the second packets with a previous phase adjustment and a previous frequency adjustment.

Example 17

The method according to any one of Examples 14-16, wherein processing the second packets includes filtering the second packets utilizing an open-loop low-pass filter.

Example 18

The method according to any one of Examples 14-17, wherein selecting the first packets for the phase processing comprises selecting the first packets responsive to a minimum transit time.

Example 19

The method according to any one of Examples 14-18, wherein selecting the second packets for the frequency processing comprises selecting the second packets responsive to one of a minimum transit time or a mean transit time.

Example 20

An apparatus comprising: a network interface terminal of a network node, the network interface terminal to deliver and receive communication packets to and from one or more other network nodes; and processing circuitry to: process, by a closed-loop phase locked loop (PLL) controller, phase error of the communication packets communicated between the network node and the one or more other network nodes; and process frequency error of the communication packets communicated between the network node and the one or more other network nodes independently from the closed-loop PLL controller.

Example 21

The apparatus of Example 20, wherein the processing circuitry is to process the frequency error using an open-loop frequency estimator.

Example 22

A multi-path integrated phase and frequency recovery system, comprising: a phase path configured to process phase data, the phase path including a closed loop phase locked loop free of an integral portion; and a frequency path separate from the phase path, the frequency path configured to process frequency data, the frequency path including a quasi-open loop and a low pass filter.

Example 23

The multi-path integrated phase and frequency recovery system of Example 22, wherein phase and frequency bandwidths of the multi-path integrated phase and frequency recovery system are independent and programmable.

Example 24

The multi-path integrated phase and frequency recovery system according to any one of Examples 22 and 23, wherein the frequency path is configured to use only one of a forward packet stream and a reverse packet stream instead of combined OFM data.

Example 25

The multi-path integrated phase and frequency recovery system according to any one of Examples 22-24, wherein the phase path includes a phase slope limiter and the frequency path includes a frequency slope limiter.

CONCLUSION

As used in the present disclosure, the terms "module" or "component" may refer to specific hardware implementations to perform the actions of the module or component or software objects or software routines that may be stored on or executed by general purpose hardware (e.g., computer-readable media, processing devices, without limitation) of the computing system. In various examples, the different components, modules, engines, and services described in the present disclosure may be implemented as objects or processes that execute on the computing system (e.g., as separate threads). While some of the system and methods described in the present disclosure are generally described as being implemented in software (stored on or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation." or "one or more of A, B, and C, without limitation" is used, in general such a construction is intended to include A alone, B alone, C alone, A and B together, A and C together, B and C together, or A, B, and C together, without limitation.

Any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
    a phase path to process phase error of communications between network nodes, the phase path including a closed-loop feedback loop controller; and
    a frequency path to process frequency error of the communications between the network nodes, the frequency path separate from the phase path,
    wherein a phase bandwidth of the apparatus is independent from a frequency bandwidth of the apparatus.

2. The apparatus of claim 1, wherein the phase bandwidth and the frequency bandwidth are programmable.

3. The apparatus of claim 1, wherein the phase path includes a phase slope limiter.

4. The apparatus of claim 1, wherein the frequency path includes a frequency change limiter.

5. The apparatus of claim 1, wherein the frequency path includes an open-loop frequency estimator.

6. The apparatus of claim 5, wherein the open-loop frequency estimator is implemented as an open-loop low-pass filter to enable multipath monitoring.

7. An apparatus, comprising:
    a phase path to process phase error of communications between network nodes, the phase path including a closed-loop feedback loop controller; and
    a frequency path to process frequency error of the communications between the network nodes, the frequency path separate from the phase path,
    wherein the frequency path is to processes one of a forward packet stream, a reverse packet stream, or combined phase data from the forward packet stream and the reverse packet stream.

8. The apparatus of claim 7, wherein the one of the forward packet stream, the reverse packet stream, or the combined phase data is selectable to be processed by the frequency path responsive to noise levels of the forward packet stream and the reverse packet stream.

9. An apparatus, comprising:
    a phase path to process phase error of communications between network nodes, the phase path including a closed-loop feedback loop controller; and
    a frequency path to process frequency error of the communications between the network nodes, the frequency path separate from the phase path,
    wherein the closed-loop feedback loop controller includes a closed-loop phase locked loop (PLL) controller,
    wherein the closed-loop PLL controller is free of an integral portion.

10. An apparatus, comprising:
    a phase path to process phase error of communications between network nodes, the phase path including a closed-loop feedback loop controller; and
    a frequency path to process frequency error of the communications between the network nodes, the frequency path separate from the phase path, wherein a total bandwidth of the phase path in parallel with the frequency path is a greater one of a phase bandwidth of the phase path and a frequency bandwidth of the frequency path.

11. An apparatus, comprising:
a phase path to process phase error of communications between network nodes, the phase path including a closed-loop feedback loop controller; and
a frequency path to process frequency error of the communications between the network nodes, the frequency path separate from the phase path,
wherein a total damping factor of the phase path in parallel with the frequency path is a ratio of a phase bandwidth of the phase path to a frequency bandwidth of the frequency path.

12. A method of processing phase error and frequency error, the method comprising: selecting first packets for phase processing;
processing the first packets for the phase error;
selecting second packets for frequency processing; and
processing the second packets for the frequency error independently of the processing of the first packets,
wherein selecting first packets for phase processing comprises compensating phase values of the first packets with a previous phase adjustment and a previous frequency adjustment.

13. The method of claim 12, wherein processing the second packets includes filtering the second packets utilizing an open-loop low-pass filter.

14. A method of processing phase error and frequency error, the method comprising:
selecting first packets for phase processing;
processing the first packets for the phase error;
selecting second packets for frequency processing; and
processing the second packets for the frequency error independently of the processing of the first packets,
wherein selecting second packets for frequency processing comprises compensating phase values of the second packets with a previous phase adjustment and a previous frequency adjustment.

15. A method of processing phase error and frequency error, the method comprising:
selecting first packets for phase processing;
processing the first packets for the phase error;
selecting second packets for frequency processing; and
processing the second packets for the frequency error independently of the processing of the first packets,
wherein selecting the first packets for the phase processing comprises selecting the first packets responsive to a minimum transit time.

16. A method of processing phase error and frequency error, the method comprising:
selecting first packets for phase processing;
processing the first packets for the phase error;
selecting second packets for frequency processing; and
processing the second packets for the frequency error independently of the processing of the first packets,
wherein selecting the second packets for the frequency processing comprises selecting the second packets responsive to one of a minimum transit time or a mean transit time.

17. An apparatus comprising:
a network interface terminal of a network node, the network interface terminal to deliver and receive communication packets to and from one or more other network nodes; and
processing circuitry to:
process, by a closed-loop phase locked loop (PLL) controller, phase error of the communication packets communicated between the network node and the one or more other network nodes; and
process frequency error of the communication packets communicated between the network node and the one or more other network nodes independently from the closed-loop PLL controller,
wherein a phase bandwidth of the apparatus is independent from a frequency bandwidth of the apparatus.

18. The apparatus of claim 17, wherein the processing circuitry is to process the frequency error using an open-loop frequency estimator.

* * * * *